United States Patent [19]

Lewyn

[11] Patent Number: 4,875,046
[45] Date of Patent: Oct. 17, 1989

[54] CENTROIDING ALGORITHM FOR NETWORKS USED IN A/D AND D/A CONVERTERS

[75] Inventor: Lanny L. Lewyn, Laguna Beach, Calif.

[73] Assignee: Brooktree Corporation, San Diego, Calif.

[21] Appl. No.: 884,472

[22] Filed: Jul. 11, 1986

[51] Int. Cl.$^4$ ............................................. H03M 1/76
[52] U.S. Cl. ..................................... 341/148; 341/150
[58] Field of Search ................ 340/347 DA; 341/148, 341/150

[56] References Cited

U.S. PATENT DOCUMENTS

| | | | |
|---|---|---|---|
| 4,198,622 | 4/1980 | Connolly, Jr. et al. | 341/148 |
| 4,462,021 | 7/1984 | Watanabe | 340/347 DA |
| 4,543,560 | 9/1985 | Holloway | 340/347 DA |
| 4,658,240 | 4/1987 | Bixby | 341/148 |
| 4,661,802 | 4/1987 | Yukawa | 341/150 |
| 4,695,826 | 9/1987 | Ando | 340/347 DA |

OTHER PUBLICATIONS

McCreary, "IEEE Journal of Solid-State Circuits", vol. SC-10, No. 6, Dec. 1975, pp. 371–379.

Primary Examiner—William M. Shoop, Jr.
Assistant Examiner—Marc S. Hoff
Attorney, Agent, or Firm—Ellsworth R. Roston; Charles H. Schwartz

[57] ABSTRACT

A digital-to-analog converter includes a decoding network and a plurality of output members such as capacitors. The decoding network receives a plurality of binary signals individually having logic levels respectively coding for binary "1" and binary "0" and individually coding for a binary value of an individually weighted significance and cumulatively coding for an analog value. The network decodes the logic levels of the binary signals and activates output members in accordance with such decoding. As the analog value coded by the logic levels of the binary signals increases, the output members previously activated in the plurality remain activated and other output members in the plurality become activated. The decoding network and the output members are disposed on an integrated circuit chip. Dependent upon their positioning on the chip, the output members have different characteristics which cause errors to be produced in the analog signal, particularly at low analog values. This invention compensates for such errors. The invention includes a second converter disposed on the chip with a construction substantially identical to the first converter and rotated on the chip substantially 180° relative to the first converter. In this way, pairs of output members of the same binary significance may have, on the average, a median position in a first direction. Individual ones of the output members in the second plurality may have the same positioning, in a second direction co-ordinate with the first direction, as corresponding ones of the output members in the first plurality.

32 Claims, 6 Drawing Sheets

| FIG. 4 | | | | | | | | | | INTERPOLATION |
|---|---|---|---|---|---|---|---|---|---|---|
| "1" | "2" | "4" | \multicolumn{7}{c|}{CAPACITOR IN FIG. 1} | LINE |
| 0 | 0 | 0 | A | E | C | G | B | F | D | A |
| 1 | 0 | 0 | A | E | C | G | B | F | D | E |
| 0 | 1 | 0 | A | E | C | G | B | F | D | C |
| 1 | 1 | 0 | A | E | C | G | B | F | D | G |
| 0 | 0 | 1 | A | E | C | G | B | F | D | B |
| 1 | 0 | 1 | A | E | C | G | B | F | D | F |
| 0 | 1 | 1 | A | E | C | G | B | F | D | D |
| 1 | 1 | 1 | A | E | C | G | B | F | D | H |

| RESISTANCE | $A$ RESISTANCE VALUE | $\dfrac{A}{A_{FS}}$ PERCENTAGE OF CUMULATIVE RESISTANCE VALUES TO TOTAL RESISTANCE VALUE | $\dfrac{P}{P_{FS}}$ PERCENTAGE OF CUMULATIVE IDEAL RESISTANCE VALUE TO TOTAL IDEAL RESISTANCE VALUE | INT LIN $\left(\dfrac{A}{A_{FS}} - \dfrac{P}{P_{FS}}\right) \times 100$ PERCENTAGE DIFFERENCE BETWEEN VALUES IN COLUMNS 3 & 4 |
|---|---|---|---|---|
| 230 | 1000 | .12456 | .125 | .044% |
| 232 | 1001 | .24925 | .250 | .075% |
| 234 | 1002 | .34707 | .375 | .093% |
| 236 | 1003 | .49900 | .500 | .1 % |
| 238 | 1004 | .62407 | .625 | .093% |
| 240 | 1005 | .74925 | .750 | .075% |
| 242 | 1006 | .87456 | .875 | .044% |
| 244 | 1007 / 8028 | 1.00000 | 1.000 | .000 |

| RESISTANCE | RESISTANCE VALUE | RESISTANCE | RESISTANCE VALUE | RESISTANCE VALUE AT 2ND AND 4TH COLUMN IN PARALLEL | RELATIONSHIP OF CUMULATIVE RESISTANCES IN FIFTH COLUMN TO TOTAL | RELATIONSHIP OF CUMULATIVE VALUES OF IDEAL RESISTANCES TO IDEAL TOTAL | PERCENTAGE DIFFERENCE BETWEEN VALUES IN COLUMNS SIX AND SEVEN |
|---|---|---|---|---|---|---|---|
| 230 | 1000 | 244a | 1007 | 501.7439 | .1249991 | 0.1250000 | 0.00009 % |
| 232 | 1001 | 242a | 1006 | 501.7469 | .2499990 | 0.2500000 | 0.00010 % |
| 234 | 1002 | 240a | 1005 | 501.7489 | .3749994 | 0.3750000 | 0.00006 % |
| 236 | 1003 | 238a | 1004 | 501.7499 | .5000000 | 0.5000000 | 0.00000 % |
| 238 | 1004 | 236a | 1003 | 501.7499 | .6250006 | 0.6250000 | 0.00006 % |
| 240 | 1005 | 234a | 1002 | 501.7489 | .7500010 | 0.7500000 | 0.00010 % |
| 242 | 1006 | 232a | 1001 | 501.7469 | .8750009 | 0.8750000 | 0.00009 % |
| 244 | 1007 | 230a | 1000 | 501.7439 | 1.0000000 | 1.0000000 | 0.00007 % |

4013.9792

CENTROIDING ALGORITHM FOR NETWORKS USED IN A/D AND D/A CONVERTERS

This invention relates to a digital-to-analog converter. More particularly, the invention relates to a converter which minimizes differential errors. The invention is particularly adapted to correct for differential errors in converters which are monotonic.

Various types of equipment receive information in analog form. Such equipment includes process control equipment, measuring instruments, communications equipment and a wide variety of other equipments. Digital computers and data processing systems often receive input parameters in analog form from such equipments and convert these parameters to digital form for processing in the computers or the data processing equipments. After the analog information has been converted to digital information and has been processed, the output information from the digital computers or the data processing equipments is often converted to analog form. By converting the digital information to analog form, the user can assimilate the information in ways which would be difficult if the information remained in digital form.

A good example of the conversions described in the previous paragraph is in the recording and reproduction of music. The music is produced in analog form. It is converted to digital form by recently developed data processing techniques and is recorded in digital form on a medium such as a tape or a disc. When the music is to be reproduced, it is converted again to analog form because this is the form which is necessary to operate sound transducers to give meaning to the listener when he hears the music.

As digital computers and data processing equipments have become widespread throughout industry and the office and have even become common in the home, the need for inexpensive, simple and reliable apparatus for converting information between digital and analog forms has become of increasing concern. A considerable effort has been devoted over a period of several decades to provide converting apparatus which is simple, inexpensive and reliable. In spite of such efforts, the converting apparatus now in use does not meet such criteria.

The converting apparatus now in use also has other problems of long standing. For example, the converting apparatus now in use may not be monotonic unless it is quite expensive and complex. By "monotonic" is meant that digital information of progressively increasing value is converted to analog information of progressively increasing value without any decrease in the analog value as the digital value progressively increases.

The converting apparatus now in use also has relatively high differential and integral nonlinearities unless the apparatus is quite complex and expensive. Integral nonlinearities result from errors produced in a conversion between digital and analog values over a wide range of such values. Differential nonlinearities result in errors produced in a conversion between digital and analog values over a relatively narrow range of such value.

The differential errors result primarily from differences in the characteristics of the elements which operate in the converter to provide the output signals. This is particularly true when the output members are formed on an integrated circuit chip. These differences and characteristics result primarily from an inability to produce output elements of substantially uniform characteristics across the chip. The differential errors in the converters now in use are specially pronounced for low digital and analog values. The differential errors are more pronounced at low digital values than at high digital values because there are less output elements activated at low values than at high values and there is accordingly a decreased opportunity to average errors at the low digital values.

The converting apparatus now in general use also has a problem of major proportions. This results when the converter is operating near the mid-point of its full scale range, or near mid scale, and digital values are increased incrementally by a single digit. For example, mid-scale problems result in the 12-bit converters now in use when a binary representation of 2047 is converted to a binary representation of 2048. This results from the fact that the binary representation of 2047 is represented by 011111111111 and a binary representation of 2048 is represented by 100000000000 where the least significant digit is at the right. Thus, at mid-scale, the value of every one of the binary digits changes. As all the binary values change, different weighting elements within the converter are selected. As a result, discontinuities may occur. These discontinuities may prevent the converter from being truly monotonic. This problem even exists in converters which are made quite complex in an attempt to overcome the problem.

In copending application Ser. No. 383,544 filed by Henry S. Katzenstein on June 1, 1982, for "Apparatus for Converting Data Between Analog and Digital Values" and assigned of record to the assignee of record of this application, apparatus is disclosed and claimed for converting between digital and analog values on a monotonic basis. The converter disclosed and claimed in application Ser. No. 383,544 has certain important advantages. For example, the converter provides an instantaneous conversion between digital and analog values on a monotonic basis for any digital value. The converter provides this conversion with relatively low differential and integral nonlinearities. The converter is quite simple in construction and is reliable in operation.

In copending application Ser. No. 553,041 filed by Henry S. Katzenstein on Nov. 18, 1983, for "Apparatus for Converting Data Between Digital and Analog Values" and assigned of record to the assignee of record in this application, a converter is also disclosed and claimed for converting between digital and analog values. The converter of application Ser. No. 553,041 constitutes an improvement over the converter of application Ser. No. 383,544, at least for converting information at relatively low frequencies. The converter of application Ser. No. 553,041 is similar to the converter of application Ser. No. 383,544 except that it employs energy storage members such as electrical capacitors to provide a conversion between digital and analog values. The converter of application Ser. No. 553,041 is also advantageous in that the number of binary bits capable of being converted on an integrated circuit chip is enhanced and the energy storage members can be easily formed on the chip. The use of such energy storage members is also advantageous because they can be formed with relatively small differences between them and because they are relatively stable with changes in temperature.

Although the capacitors of application Ser. No. 553,041 have relatively small differences between them, differences as great as one percent (1%) or two percent (2%) in value can still exist between the capacitors on one side of an integrated circuit chip and the capacitors on the other side of the integrated circuit chip. These differences tend to progress somewhat linearly across the chip. These differences tend to create a distortion, or differential error, in the sound which is produced on compact discs when the amplitude of the sound is relatively low. Although the distortion in sound is relatively low, it is particularly noticeable in comparison to the high fidelity which is produced in the sound when the amplitude of the sound is increased.

This invention provides an improved digital-to-analog converter for eliminating, or at least minimizing, distortions in the conversion between digital and analog values. Although the improvement eliminates, or at least minimizes, differential errors for all digital values, the invention has particular utility in eliminating distortions, or differential errors, for low digital values. The improved converter has particular utility in converting digital signals into audible sound but it can be used in any other application. Although the improved converter has been initially conceived to be operable in a converter of the type disclosed and claimed in application Ser. No. 553,041, it will be appreciated that the improvement constituting this invention can be used in any other type of converter.

In one embodiment of the invention, a digital-to-analog converter includes a decoding network and a plurality of output members such as capacitors. The decoding network receives a plurality of binary signals individually having logic levels respectively coding for binary "1" and binary "0" and individually coding for a binary value of an individual weighted significance and cumulatively coding for an analog value. The network decodes the logic levels of the binary signals and activates output members in accordance with such decoding. As the analog value coded by the logic levels of the binary signals increases, the output members previously activated in the plurality remain activated and other output members in the plurality become activated.

The decoding network and the output members are disposed on an integrated circuit chip. Dependent upon their positioning on the chip, the output members have different characteristics which cause errors to be produced in the analog signal, particularly at low analog values. These differences in characteristics of the output members tend to progress linearly with progressive positions across the chip.

This invention compensates for such errors. The invention includes a second converter disposed on the chip with a construction substantially identical to that of the first converter and rotated on the chip substantially 180° relative to the first converter. In this way, pairs of output members of the same binary significance may have, on the average, a median position in a first direction. Individual ones of the output members in the second plurality may have the same positioning, in a second direction co-ordinate with first direction, as corresponding ones of the output members in the first converter.

Figure 1:
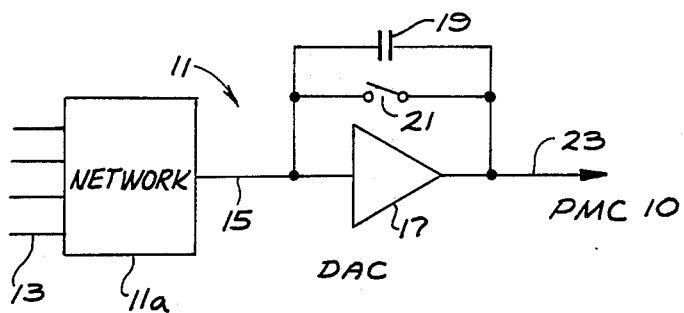
FIG. 1 is a schematic diagram, primarily in block form, of a converter for converting digital values into analog values.
Figure 2:
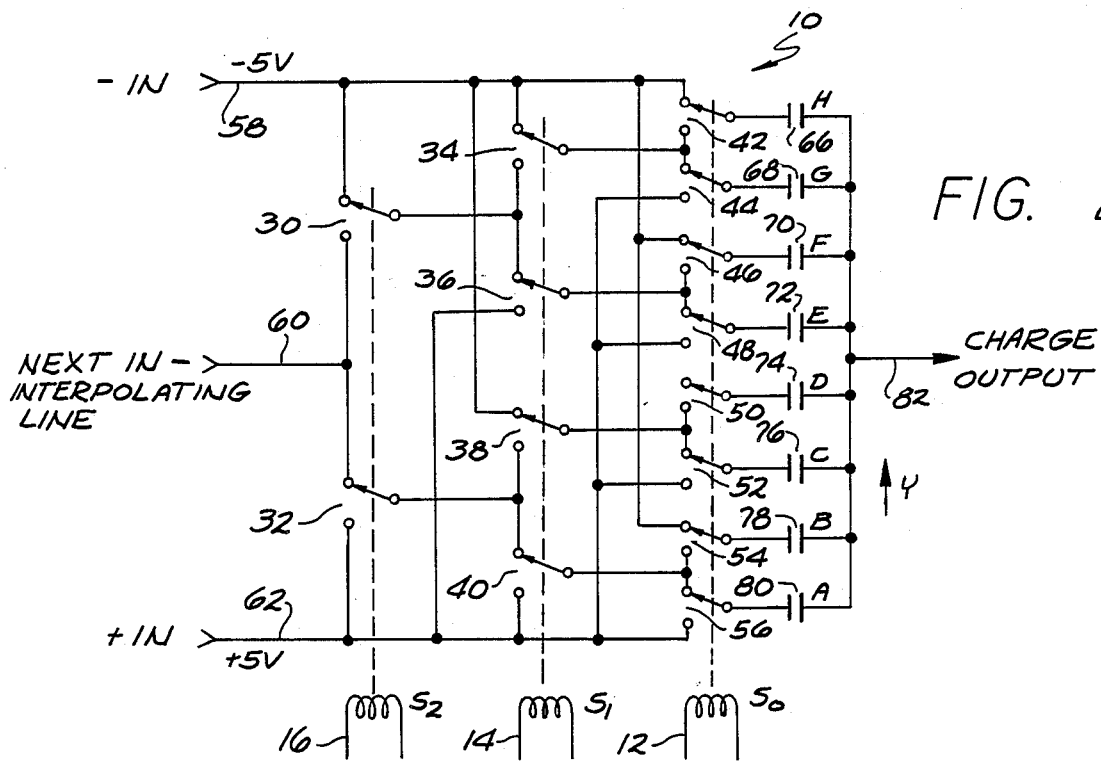
FIG. 2 is a circuit diagram schematically illustrating a charge redistribution weighting network such as disclosed and claimed in application Ser. No. 553,041, this network being included in the converter shown in FIG. 1.
Figures 3A, 3B, 3C, 3D:
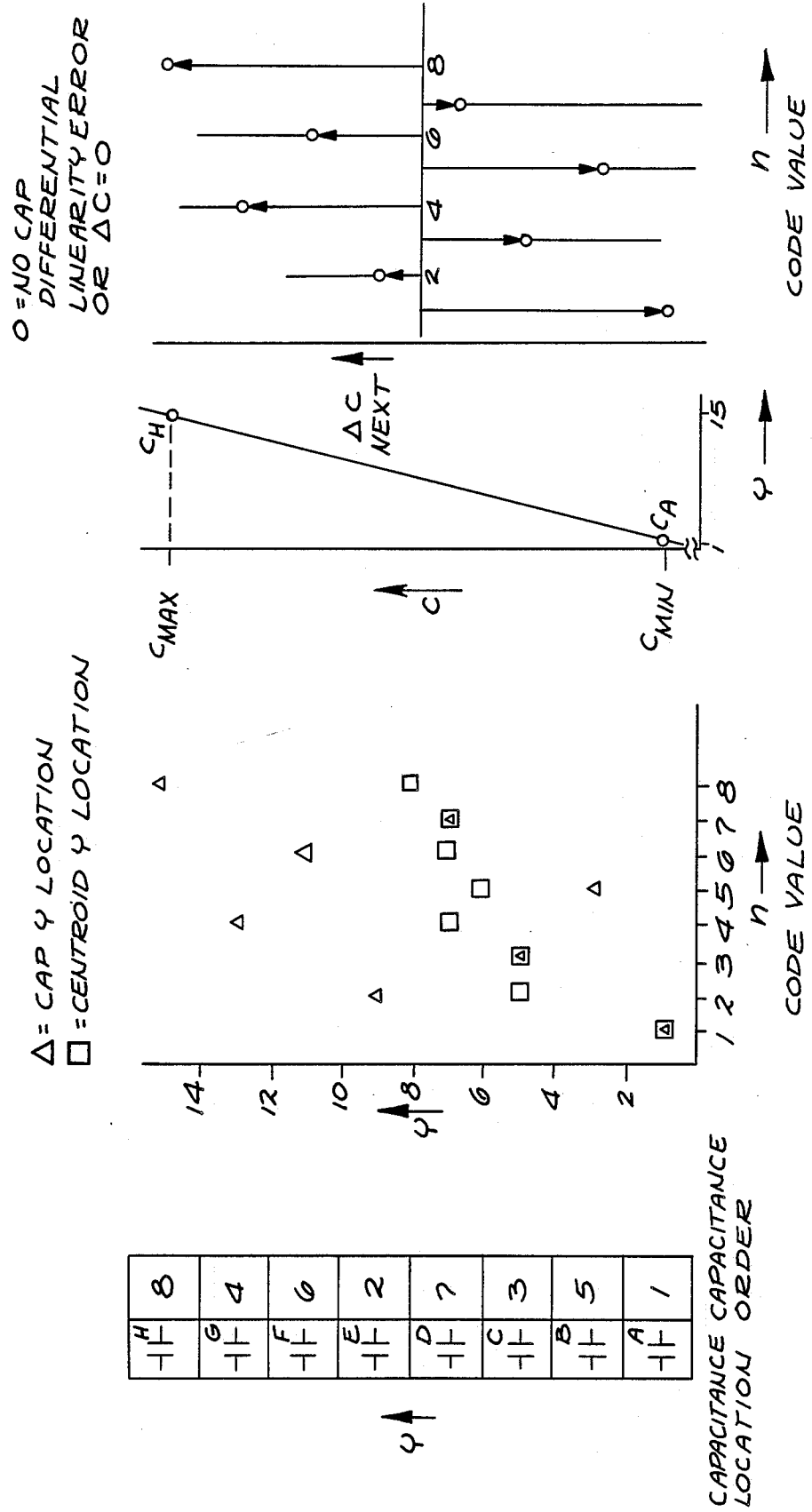
FIG. 3a is a schematic view illustrating the relative positioning on an integrated circuit chip of output members such as capacitors in the circuit diagram of FIG. 2 and further illustrating the order in which such output members are activated for progressive increases in the digital value.
FIG. 3b is a chart schematically illustrating the relative position on the integrated circuit chip of the different capacitors shown in FIG. 2 and the weighted average of the relative position on the integrated circuit chip of such capacitors for progressive analog values.
Figures 5, 6:
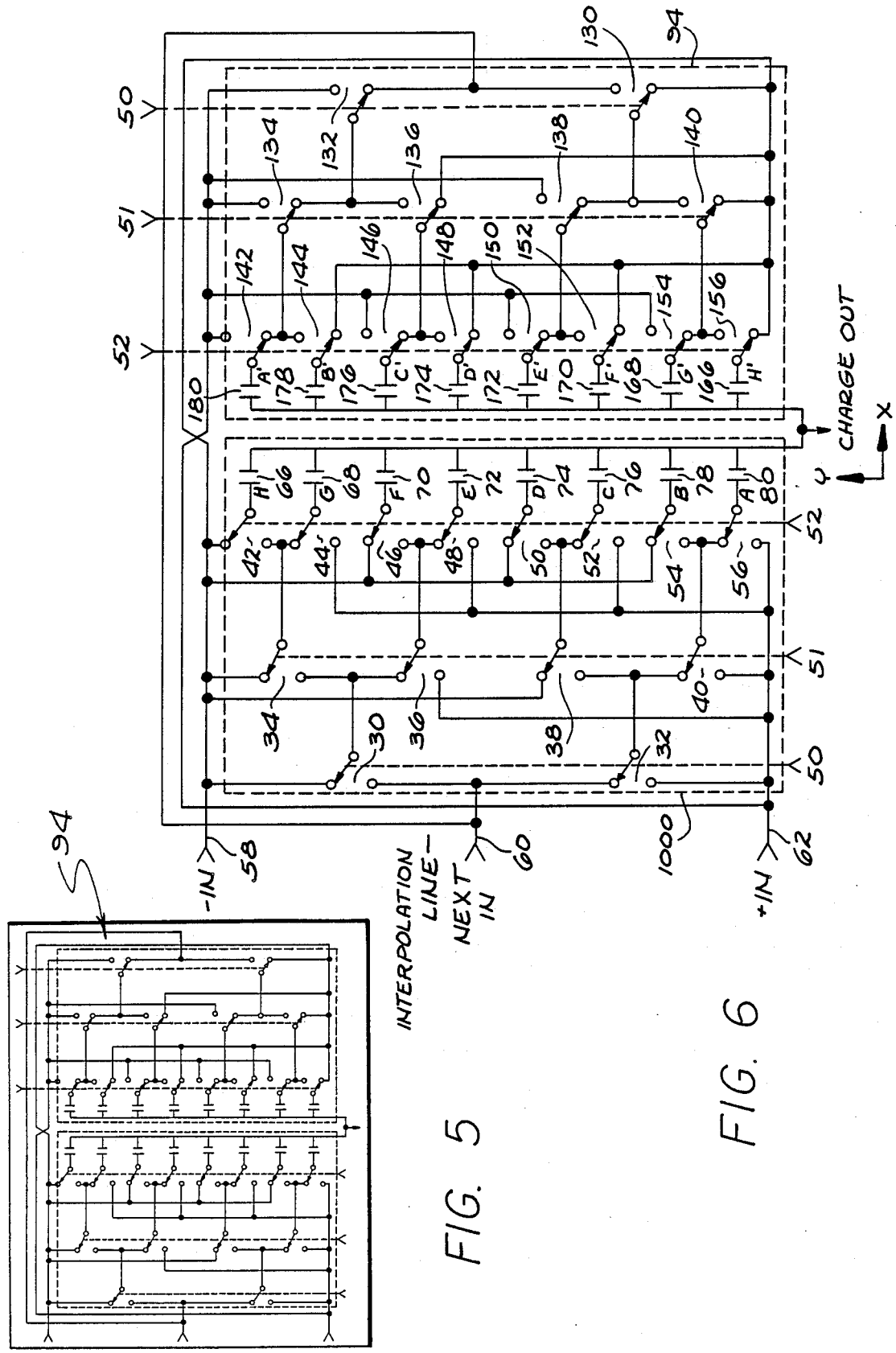

FIG. 3c a graph illustrating the different positionings of the individual capacitors in the circuit diagram of FIG. 2 for progressive analog values and the progressive change in the relative values of such capacitors as a result of such differences in position;

FIG. 3d is a graph illustrating the difference in vale between the next capacitor to be switched into the network oa FIG. 2 and the mean or median capacitor value in the network, FIG. 4 is a truth table illustrating the operation of the circuitry shown in FIG. 2;

FIG. 5 is a schematic representation of an integrated circuit chip and the disposition on the chip of a network constituting one embodiment of the invention, this network being included in the converter shown in FIG. 1;

FIG. 6 is a circuit diagram schematically illustrating the electrical construction of a charge redistribution weighting network, similar to theat shown in FIG. 2, constituting an embodiment of this invention as shown in FIG. 5;

FIG. 7a is a view similar to that shown in FIG. 3a but illustrates the relative positions of, and the order of activating, the different output members such as the capacitors in the circuit diagram of FIG. 6;

FIG. 7b is a graph similar to that shown in FIG. 3b and illustrates the relative positioning on the integrated circuit chip of the individual capacitors in the circuit diagram of FIG. 6 and the weighted average of the relative positioning of such capacitors on the integrated circuit chip for progressive analog values;

FIG. 7c is a graph similar to that shown in FIG. 3c and illustrates the different positionings in the integrated circuit chip of the individual capacitors in the circuit diagram of FIG. 6 and the progressive change in the relative values of such capacitors as a result of such differences in position;

FIG. 7d is a graph similar to that shown in FIG. 3d and illustrates the difference in value between the next pair of capacitors to be switched into the network of FIG. 6 and the mean or median capacitor value in the network.

Figures 8, 9:
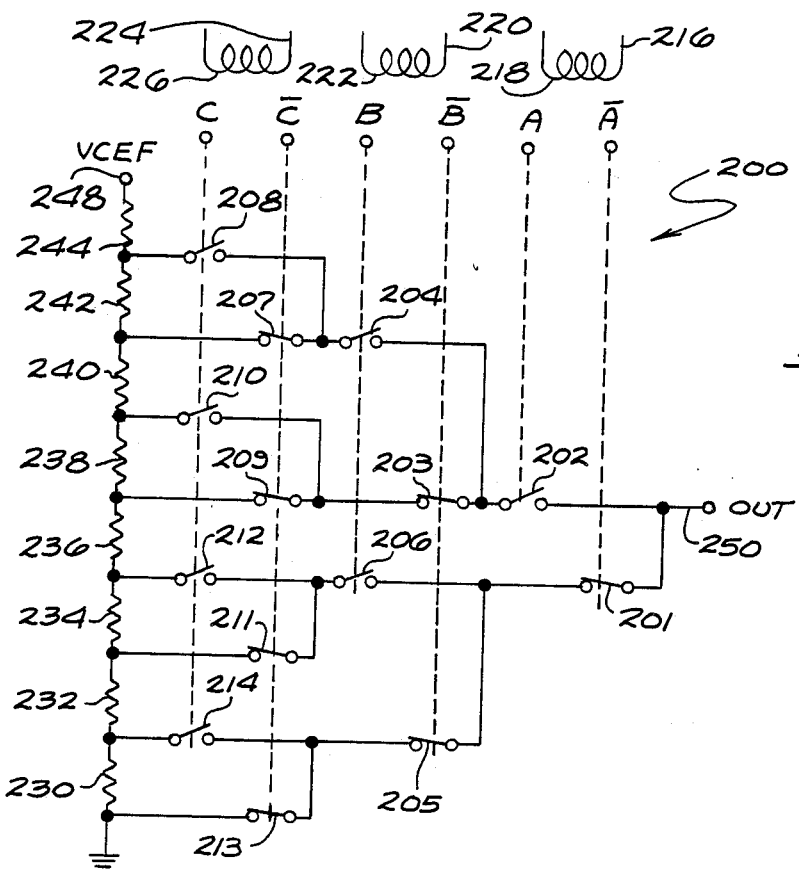
Figures 10, 11:
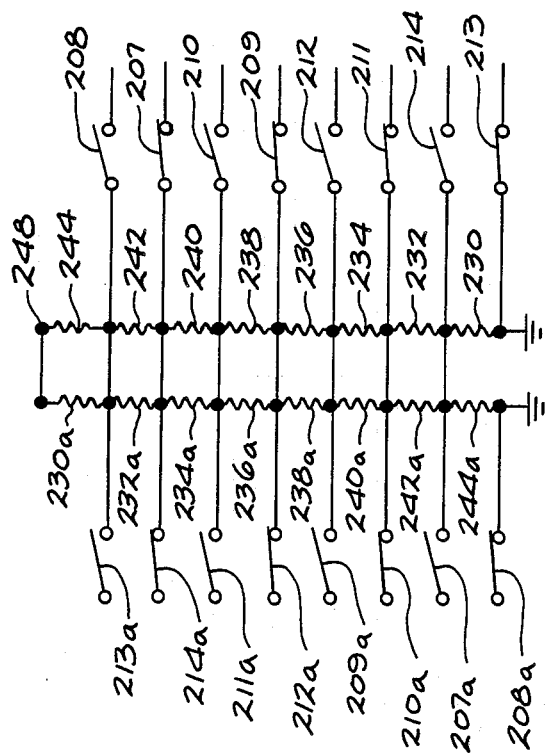

FIG. 8 illustrates a prior art embodiment of another network which may be included in the digital-to-analog converter shown in FIG. 1;

FIG. 9 is a table illustrating the operation of the network shown in FIG. 8 and specifying output values obtained by the network in performing such operation;

FIG. 10 illustrates the adaptation of the network shown in FIG. 8 to obtain another embodiment of the invention; and FIG. 11 is a table illustrating the operation of the network shown in FIG. 10 and specifying output values obtained by the network in performing such operation.

FIG. 1 illustrates a block diagram of a digital-to-analog converter generally indicated at 11. The converter 11 provides on input lines 13 a plurality of binary signals having first and second logic levels which respectively code for binary values of "1" and "0". Each of these signals has an individually weighted binary significance such as $2^0$, $2^1$, $2^2$, etc. The converter 11 includes a network 11a which operates upon these signals to convert these signals to a resultant signal on a line 15. The signal on the line 15 has an amplitude corresponding to the analog value coded by the logic levels of the signals on the input lines 13. The signal on the line 15 is introduced to an operational amplifier 17 across which is connected a storage member such as a capacitor 19. The amplifier 17 operates to provide in the capacitor 19 a charge coding for the analog value. This charge is introduced to an output line 23. This charge is periodically discharged when a switch 21 is closed so that a new charge can be developed across the capacitance 19 to represent an updated analog value.

FIG. 2 illustrates the construction of a network (shown schematically in FIG. 1 at 11a) which is generally indicated at 10 and which is disclosed and claimed in copending application Ser. No. 553,041. The network 10 converts into analog form digital values preferably coded by the logic levels of binary signals. These binary signals may have first and second logic levels respectively coding for a binary "1" and a binary "0". Each of the binary signals codes for a binary value of different weighted significance. For example, binary signals are introduced to lines 12, 14 and 16 respectively to code for analog values "1", "2" and "4". Although the network 10 is shown as decoding and converting three (3) binary signals into analog form, the network 10 may be expanded to receive any desired number of binary signals and to convert into analog form the binary values coded by these binary signals.

The network 10 includes a plurality of double pole switches 30 through 56 (even numbers only). The switches 30 and 32 may be considered to constitute a first sub-set; the switches 34, 36, 38 and 40 may be considered to constitute a second sub-set; and the switches 42 through 56 (even numbers only) may be considered to constitute a third sub-set. Each sub-set of switches is actuated when a signal having a logic level coding for a binary "1" passes through an individual one of the lines 12, 14 and 16. The switches 30 and 32 are actuated in accordance with the logic levels of binary signals produced on the line 12 and coding for the least binary significance; the switches 34, 36, 38 and 40 are actuated in accordance with the logic levels of binary signals produced on the line 14 and coding for an increased binary significance; and the switches 42 through 56 (even numbers only) are actuated in accordance with the logic levels of the binary signals produced on the line 16 and coding for a greater binary significance than those on the lines 12 and 14.

The signals produced on the lines 12, 14 and 16 are respectively introduced to solenoids $S_0$, $S_1$ and $S_2$ to energize the solenoids when the logic levels of the signals on the lines represent a binary "1". When energized, the solenoids $S_0$, $S_1$ and $S_2$ actuate the movable poles of the associated switches from the upper positions to the lower positions in FIG. 2. The association between the solenoids and the switches is represented by broken vertical lines in FIG. 2.

The switches shown in FIG. 2 are mechanical. However, as will be appreciated, the switches may be solid state. For example, embodiments of converters employing solid state switches are disclosed and claimed in applications Ser. Nos. 383,544 and 553,041. When solid state switches are employed, each of the switches 30 through 56 (even numbers only) may be replaced by a pair of switches. One of the switches in each pair is closed at each instant and the other switch in the pair is open. The particular switch closed, and the particular switch open, in each pair is dependent upon the logic level of the binary signal controlling the operation of the switches in the pair. Actually, each of the switches 30 through 56 (even numbers only) may be considered as a pair with the movable contact and one pole defining one switch in the pair and the movable contact and the other pole defining the other switch in the pair.

One contact of the switch 30 is common with a line 58 and the other contact in the switch 30 is common with a line 60. The line 58 may receive a voltage such as $-5$ volts from a voltage supply. Similarly, one contact in the switch 32 is common with a line 62 and the other contact in the switch is common with the line 60. The line 62 may receive an activating voltage such as $+5$ volts from a voltage supply. Connections are made from the movable poles of the switch 30 to first contacts of the switches 34 and 36. Similarly, connections are made from the movable poles of the switch 32 to first contacts of the switches 38 and 40.

The second contact of the switch 34 is connected to the line 58 and the second contact of the switch 36 is connected to the line 62. Connections are correspondingly made from the second contact of the switch 38 to the line 58 and from the second contact of the switch 40 to the line 62. The movable poles of the switches 34, 36, 38 and 40 are respectively connected to first contacts of the switches 42 and 44, first contacts of the switches 46 and 48, first contacts of the switches 50 and 52 and first contacts of the switches 54 and 56.

The second contacts of the switches 42, 46, 50 and 54 are connected to the line 58 and the second contacts of the switches 44, 48, 52 and 56 are connected to the line 62. The movable poles of the switches 44 through 56 (even numbers only) are connected to first terminals of storage members such as capacitors 66 through 80 (even numbers only). As will be seen in FIGS. 2 and 3, the capacitors 66 through 80 (even numbers only) are respectively designated by the numeral "H" through "A". The second terminals of the capacitors 66 through 80 (even numbers only) are connected to a line 82.

The network 10 shown in FIG. 2 and described above may be considered to be recursive. In other words, the switches in each sub-set have the same connections to the switches in the sub-sets of next highest and lowest significance as the switches in other sub-sets have to the switches of next highest and lowest significance relative to such other sub-sets. This recursive relationship allows the network 10 to be expanded easily to respond to the logic levels of any desired number of input signals each of which has an individual binary significance.

The movable poles of the switches 30 through 56 (even numbers only) are shown in FIG. 2 in the positions in which they are operative when the binary signals introduced to the switches have a logic level of "0". With the movable contacts of the switches 30 through 56 (even numbers only) in the positions shown in FIG. 2, no connections are established between any of the capacitors 66 through 80 (even numbers only) and the activating line 62. As a result, none of the capacitors 66 through 80 (even numbers only) is charged by the voltage on the line 62. This corresponds to an analog value of "0" in accordance with the logic levels of the binary signals introduced to the lines 12, 14 and 16.

For an analog value of "0", a connection is established which includes the interpolation line 60, the switch 32, the switch 40, the switch 56 and the capacitance 80. This causes the capacitance 80 to become charged to a level dependent upon the voltage on the interpolation line 60. This voltage may be a constant or reference such as ground or it may be variable in accordance with the disclosure in application Ser. No. 755,170 filed by me on July 15, 1985, for "Apparatus for Converting Between Digital and Analog Values" and assigned of record to the assignee of record of this application. The signal on the line 60 may be variable to indicate the analog value of binary signals of lower binary significance than the signals on the line 12, 14 and 16.

When the analog value coded by the logic levels of the binary signals introduced to the lines 12, 14 and 16 in FIG. 2 has an analog value of "1" or a binary code of "001" (the least significant binary bit being at the right), this causes the movable arms of the switches 30 and 32 to be moved in FIG. 2 to a position engaging the upper contacts of the switches. A circuit is accordingly established which includes the activating line 62, the switch 32, the switch 40, the switch 56 and the capacitance 80. This causes the capacitance 80 to be charged to a value equal to the voltage on the line 62 in FIG. 2. This voltage may be a charging voltage such as +5 volts.

The charge in the capacitance 80 is introduced to the line 82 to provide an indication of the analog value of "1". The capacitance 80 is then discharged through a switch (corresponding to the switch 21 in FIG. 1), which is periodically closed to the ground. The charging and discharging cycle of the capacitances 66 through 80 (even numbers only) is fully disclosed in co-pending application Ser. No. 755,170 filed by me on July 15, 1985, and assigned of record to the assignee of record of this application.

At the same time that the capacitance 80 is charged, a connection is established which includes the interpolating line 60, the switch 30, the switch 36, the switch 48 and the capacitance 72. The capacitance 72 accordingly becomes charged to a value dependent upon the voltage on the interpolating line 60.

Similarly, for an analog value of "2", or a binary value of "010" coded by a logic level of a binary "1" on the line 14 in FIG. 2, the capacitance 80 becomes charged through a circuit including the line 62, the switch 40 and the switch 56. At the same time, the capacitance 72 becomes charged through a circuit including the line 62, the switch 36 and the switch 48. The charges in the capacitances 72 and 80 are introduced to the line 82 to indicate an analog value of "2". The capacitance 76 becomes simultaneously charged through a circuit including the interpolating line 60, the switch 32, the switch 38 and the switch 52.

As described in copending application Ser. No. 755,170, the voltage on the interpolating line 60 may have an analog value coding for the value of binary bits of lower binary significance than the lines 12, 14 and 16. The voltage may be produced on the interpolating line 60 by a converter such as shown in FIG. 2 or by a conventional converter. In this way, the output voltage on the line 82 connected to all of the capacitors 66 through 80 may represent only three binary bits if the interpolating line 60 is grounded or may represent an increased number of binary bits if the interpolating line 58 receives the voltage produced in a converter of lower binary significance than that shown in FIG. 2.

FIG. 4 indicates the capacitances which are respectfully connected to the lines 62 and 60 for each analog value coded by logic levels of the binary signals on the lines 12, 14 and 16. As will be seen in FIG. 4, the logic levels of the binary signals introduced to the lines 12, 14 and 16 are indicated in the first three columns in that figure. The analog significance of these binary signals is shown at the top of each of these columns. The remaining columns (with the exception of the last column) indicates the state of operation of the capacitances 66 through 80 (even numbers only). These capacitances are respectively indicated in FIG. 4 by the letters "H" through "A" to correspond to the letters indicated for these capacitances in FIG. 2. The last column in FIG. 4 indicates the particular one of the capacitances to be connected to the interpolation line 60 for each analog value coded by the logic levels of the binary signals on the lines 12, 14 and 16.

As will be seen in FIG. 4, two diagonal lines 90 and 92 are provided. The capacitances indicated to the left of the line 90 represent those connected to the activation line 62 for the different analog values. The capacitances isolated between the lines 90 and 92 are those which are connected to the interpolation line 60 for each analog value. These capacitances correspond to those indicated in the last column in FIG. 4. As will be seen, the capacitance connected to the interpolation line 60 for each analog value is the one to be connected next to the activation line 62 when the analog value represented by the logic levels of the binary signals coded on the lines 12, 14 and 16 increases. The capacitances shown to the right of the line 92 in FIG. 4 are connected to the line 58 for the different analog values.

FIG. 5 indicates the disposition on an integrated circuit chip, generally indicated at 94, of the circuitry shown in FIG. 1. As will be seen, the capacitances "A" through "H" are displaced at progressive positions in a y-direction (vertical direction) on a chip. The relative positions of the capacitances "A" through "H" in the y-direction on the chip 94 are also illustrated in FIG. 3a. FIG. 3a also indicates the relative analog value in which each of the capacitances "A" through "H" is connected to the activating line 62.

FIG. 3b illustrates the relative disposition of the capacitors "A" through "H" in the y-direction and also indicates in the x-direction the analog value in which each of such capacitances becomes connected to the activating line 62. The relative positions of the capacitances "A" through "H" are indicated in FIG. 3b by hollow triangles. FIG. 3b also illustrates by hollow rectangles the average position of the activated capacitances for each analog value. For example, for an analog value of "2", the average position of the activated capacitances in the y-direction is at "5" since the capacitance "A" is at a position of "1" and the capacitance "E" is at a position of "9". As will be seen, the average position of the activated capacitances in the y-direction varies between "1" and "8" for different analog values between "1" and "8".

Each of the capacitances shown in FIG. 3a should have equal values. However, FIG. 3c illustrates how the capacitances vary in value between the capacitance "A" (represented as "$C_A$") at the lowest position in the y-direction and the capacitance "H" (represented as "$C_H$") at the highest position in the y-direction. As previously indicated, the values of the capacitances tend to vary linearly with progressive positions in the y-direction. This results from processing variations such as gradients in the thickness of the oxide dielectrics in the capacitors. These gradients may be in the range of one percent (1%) to two percent (2%) over a distance of 200 mils. For example, the difference between a unit capacitor value in the transition from an analog value of "4" to an analog value of "5" may be in the order of one percent (1%) since the distances between the capacitances "G" and "B" may be in the order of 100 mils.

Assuming no lithographic errors, FIG. 3d indicates the changes in the differential linearity of the capacitors "A" through "H" from a median value for each of the analog values between "1" and "8". As will be seen, the differential nonlinearities change value from one side of the median value to the other for each progressive analog value. FIG. 3d illustrates the changes in relation to the value of the capacitance to be connected next to the interpolating line 60 for each progressive analog value. As will be seen, there are relatively great swings in the values of the capacitances to be connected next to the interpolating line 60 for each progressive analog value. These changes in the value of the capacitance connected to the interpolating line 60 for each analog value are then introduced into the activating line 62 for the next analog value of increasing magnitude.

FIG. 6 illustrates a circuit diagram constituting one embodiment of the invention. In the embodiment shown in FIG. 6, the circuit diagram shown in FIG. 2 and described above is shown at the left end and a duplicate circuit is shown at the right end. However, as will be seen in FIG. 6, the circuit at the right end is inverted, or rotated 180°, relative to the circuit at the left end. To show the identities between the different elements in the circuit at the left end of FIG. 6 and the different elements in the circuit at the right end of FIG. 6, the components at the right end of FIG. 6 are provided with the same designations as the corresponding components at the left end of FIG. 6 except for the addition of a numeral "1" before such numbers. For example, a capacitance at the left end of FIG. 6 is designated as "66" and the corresponding capacitance at the right end of FIG. 6 is designated as "166". Both circuits have the line 82 connected to the capacitances in the circuits.

Figure 7:
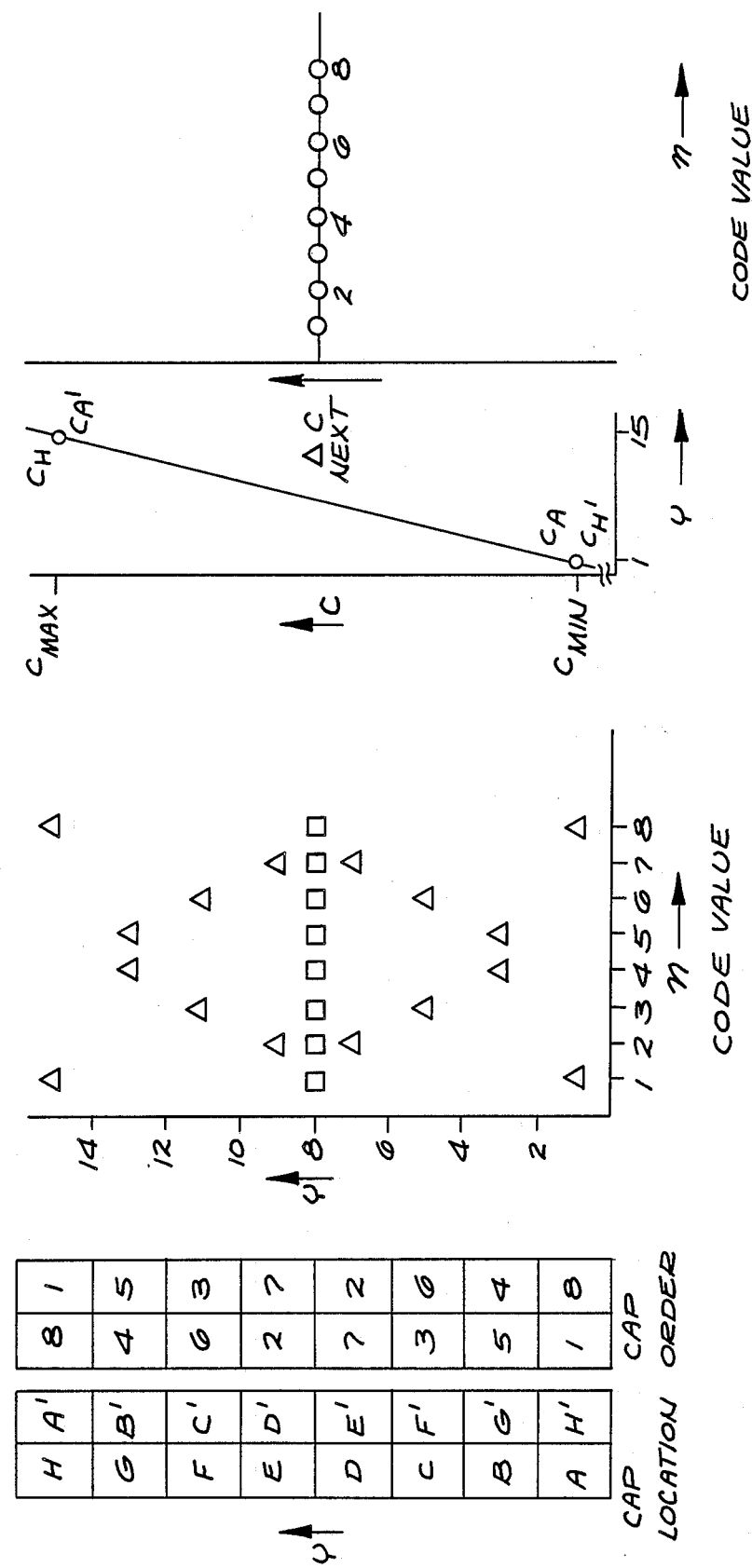

FIG. 7a is a chart similar to the chart of FIG. 3a. However, FIG. 7a shows the relative positioning of the capacitors "A" through "H" (66 through 80, even numbers only) and the capacitors A' through H' (166 through 180, even numbers only) in the y-direction on the integrated circuit chip 94 in FIG. 5. As will be seen, the positions of the capacitances A' through H' are inverted relative to the positions of the corresponding ones of the capacitors "A" through "H". In FIG. 7, the capacitors A' through H' respectively correspond to the capacitors A through H.

FIG. 7b indicates by hollow triangles the relative positions of the capacitances "A" through "H" and the capacitances "A'" through "H'" in the y-direction on the integrated circuit chip 94 for analog values from 1 through 8. The analog values are specified along the horizontal coordinate in FIG. 7b and the positions of the different capacitances in the y-direction on the chip 94 are indicated along the vertical coordinate in FIG. 7b. The median position of the capacitances for each analog value from 1 through 8 is represented in FIG. 7b by hollow rectangles. As will be seen in FIG. 7b, the median position for activated capacitances for each analog value from 1 through 8 remains constant.

FIG. 7c indicates the changes in the values of the capacitances "A" through "H" as a result of the differences in their positioning in the y-direction on the chip 94 and also indicates the changes in the values of the capacitances "A'" through "H'" as a result of the differences in their positioning on the chip. FIG. 7d indicates that there are no changes in the differential linearity of the capacitances connected to the interpolating line 60 for the different analog values from 1 through 8.

The converter shown in FIG. 6 and described above has certain important advantages. As will be seen from FIGS. 7a through 7d, as successive pairs of capacitances are connected to the activating line 62 for progressive analog values, the centroid of all of the capacitances connected to the activating line 62 remains constant. This results from the fact that the differences in the positioning of each of the capacitances A through H from a median value is individually corrected for each of the capacitances by the inclusion of the capacitances A' through H'. This causes the differential linearity of the network shown in FIG. 6 to be independent of linear gradients in the values of the capacitances 66 through 80 (even numbers only) and the capacitances 166 through 180 (even numbers only) as shown in FIGS. 3c and 7c.

In addition to linear gradients in the value of the capacitances 66 through 80 (even numbers only) and the capacitances 166 through 180 (even numbers only) in accordance with the positioning of the capacitances on the integrated circuit chip, the capacitances also have lithographic variations in individual ones of such capacitances. These variations tend to occur on a somewhat random basis on the integrated circuit chip 94. These variations may occur in the range of one tenth of one percent (0.1%) to two tenths of one percent (0.2%). These variations are reduced by the square root of two (2) in the converter shown in FIG. 6 and described above. This reduction occurs because there are twice as many capacitances on the chip 94 for the embodiment shown in FIG. 6 as for the embodiment shown in FIG. 7.

The converter shown in FIG. 6 and described above has other important advantages over the converters of the prior art. For example, since differential errors have been eliminated, or at least minimized, the converters can be used to convert digital signals to sound with complete fidelity over the full range of amplitudes. This is particularly important at low amplitudes because the converters of the prior art have introduced distortions into the sound at low amplitudes.

The networks shown in FIGS. 2 and 6 have been described with relation to capacitances as output members. However, it will be appreciated that other types of output members may be used. For example, the output members may be transistors such as disclosed and claimed in application Ser. No. 383,544. The output members may be also resistors such as ion-implanted resistors.

FIG. 8 illustrates a network which is generally indicated at 200 and which is known in the prior art for converting digital values, such as binary coded values, to analog values. The network includes a plurality of single-pole single-throw switches, 201, 202, 203, 204, 205, 206, 207, 208, 209, 209, 210, 211, 212, 213 and 214. The switches 201 and 202 may be considered as the switches of a first subset which is responsive to a binary signal on a first line 216. The signal on the line 216 causes a solenoid 218 to be energized when the signal has a logic level coding for a binary value of "1". When the solenoid 218 is energized, it causes the switch 202 to become closed and the switch 201 to become opened. The switches 201 and 202 are biased to positions providing a closure of the switch 201 and an opening of the switch 202 when a signal having a logic level coding for a binary value of "0" is produced on the line 216. Although mechanical switches are shown in FIG. 8, it will be appreciated that other types of converters such as transistors may also be used without departing from the scope of the invention.

The switches 203, 204, 205 and 206 are included in a second subset which is responsive to the logic level of the signal on a line 220. When the logic level of the signal on the line 220 codes for a binary "1", a solenoid 222 becomes energized and causes the switches 204 and 206 to become closed and the switches 203 and 205 to become opened. Similarly, the switches 204 and 206 become opened, and the switches 205 and 207 become closed, when a signal having a logic level coding for a binary value of "0" is produced on the line 220.

The switches 208, 210, 212 and 214 become closed, and the switches 207, 209, 211 and 213 become opened, when a signal having a logic level coding for a binary "1" is produced on a line 224 to energize a solenoid 226. The switches 208, 210, 212 and 214 become opened, and the switches 207, 209, 211 and 213 become opened, when a signal having a logic level coding for a binary "0" is produced on the line 224.

A resistance ladder formed by resistors 230, 232, 234, 236, 238, 240, 242 and 244 is connected in series between an energizing potential 248 and a reference potential such as ground. The resistors 230 through 244 (even numbers only) are connected to first terminals of the switches 207, 208, 209, 210, 211, 212, 213 and 214. Connections are made from second terminals of the switches 207 and 208 to a first terminal of the switch 204, from second terminals 209 and 210 to a first terminal of the switch 203, from second terminals of the switches 211 and 212 to a first terminal of the switch 206 and from second terminals of switches 213 and 214 to a first terminal of the switch 205. The second terminals of the switches 203 and 204 and of the switches 205 and 206 repectively are common with first terminals of the switches 202 and 211. The second terminals of the switches 201 and 202 are connected to an output line 250.

The embodiment shown in FIG. 8 produces a voltage on the output line 250 to code on an analog basis for the logic levels of the binary signals on the lines 216, 220 and 224. For example, for a logic level of "1" on the line 220, the switches 204 and 206 become closed and the switches 203 and 205 become opened. Under such circumstances, when the potential on the terminal 248 is +10 volts, a potential of 2 volts is produced on the input line 250 to represent an analog value of "2".

In a perfect embodiment of the network 200, the resistances 230 through 244 (even numbers only) would have equal values. However, in the practical world, the values of the resistances 230 through 244 (even numbers only) vary progressively on an integrated circuit chip such as in a linear relationship. For example, as shown in the first two columns in FIG. 9, the resistances 230 through 244 (even numbers only) may illustratively have progressive values between 1000 ohms and 1007 ohms. Column 3 in FIG. 9 illustrates the proportionate resistance value of each resistance in the resistance network (when added to the resistances above it in the resistance network in FIG. 8) in comparison to the total value of all of the resistances in the resistance network.

In column 4 of FIG. 9, proportionate resistance values of each resistance in the resistance network (when added to the resistances above it in the resistance network in FIG. 8) are also shown in comparison to the total value of all of the resistances in the resistance network. However, the values in column 4 of FIG. 9 represent an ideal situation where all of the resistances in the resistance ladder have equal values of one thousand (1000) ohms. The last column in FIG. 9 shows the difference between the columns in the third and fourth columns when multiplied by a value of one hundred (100). As a result, the values in the last column in FIG. 9 represent the percentage deviation, for different analog values, in the voltages on the output line 250 from an optimum value. As will be seen, errors as high as one tenth percent (0.1%) are produced.

FIG. 10 illustrates the network 200 when included in an embodiment of this invention with a duplicate network generally indicated at 200a. As will be seen, the network 200a is inverted relative to the network 200 and is disposed in back-to-back relationship to the network 200. As a result, resistances 244a, 242a, 240a, 238a, 236a, 234a, 232a and 230a in the network 200a are respectively paired with the resistances 230, 232, 234, 236, 238, 240, 242, and 244 in the network 200.

The first two columns of FIG. 11 are identical to the first two columns of FIG. 9. The third column indicates the paired resistance in the network 200a corresponding to the particular resistance indicated in the first column of FIG. 11. The fourth column in FIG. 11 indicates values of the resistances shown in the third column of FIG. 11.

As will be appreciated, each pair of resistances in the embodiment of FIG. 10 is connected in parallel. The fifth column in FIG. 11 indicates the value of each such parallel pair of resistances. The sixth column in FIG. 11 indicates the value determined by using the value in the sixth column of FIG. 11 as a numerator (when added with all of the values above it in the sixth column of FIG. 11) and the sum of all of the resistance values in the sixth column of FIG. 11 as a denominator. The seventh column indicates the ideal values corresponding to those specified in the fourth column of FIG. 9. These represent ideal conditions where all of the resistances in the resistance ladder have values of one thousand (1000) ohms. The values in the seventh column of FIG. 11 represent the value of each ideal resistance (when added to the values of all of the ideal resistances above it in the seventh column of FIG. 11) as a numerator and the sum of all of these ideal resistances as a denominator.

The eighth column in FIG. 11 indicates the difference between the paired values in the sixth and seventh columns of FIG. 11, this difference then being multiplied by one hundred (100). The value in the eighth column of FIG. 8 accordingly represents the percentage deviation or error from a optimum value in the output indications of the network shown in FIG. 10. As will be seen, the maximum deviation or error is one ten thousandth of one percent (0.0001%). This compares to a maximum error of one tenth of one percent (0.1%) for the prior art embodiment shown in FIG. 8. In other words, the embodiment shown in FIG. 10 provides output indications one thousand times more accurate than the prior art embodiment shown in FIG. 8.

Although this invention has been disclosed with respect to particular embodiments of a converter, it will be appreciated that the invention can be used with any converter. For example, the invention can be used with any types of decoders which are of the thermometer type - that is, decoders in which, for progressively increasing analog values, output members (such as capacitances) previously activated remain activated and additional output members such as capacitances become activated. This is represented by the embodiment shown in FIGS. 5 and 6. The invention can also be used with decoders which are not of the thermometer type. An example of this type of converter is the binary-weighted tree decoder shown in FIGS. 8 and 10.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for converting a binary coded value into an analog value,
    means for providing a plurality of signals each having first and second logic levels coding for binary values of "1" and "0" and each identifying a binary value of an individual binary significance, the signals in the plurality cumulatively coding for the analog value,
    an integrated circuit chip,
    means disposed on the integrated circuit chip for decoding the logic levels of the binary signals in the plurality,
    a plurality of output means each disposed on the chip at an individual position in a first direction relative to a centroid position to produce an output signal having characteristics dependent upon such individual disposition, each of the output means in the plurality being operatively coupled to the decoding means to provide the output signal for an individual one of the analog values and for all analog values less than such individual analog value, and
    means disposed on the integrated circuit chip for producing additional signals each having characteristics corresponding substantially to the characteristics of the signal from an individual one of the output means in the plurality but offsetting the characteristics produced in the output signal, from such individual one of the output means as a result of the disposition of such individual one of the output means in the plurality at the individual position in the first direction relative to the centroid position, to obtain the production of signals, for each of the analog values coded by the logic levels of the binary signals, corresponding to that which would be obtained for a disposition of each of the output means in the plurality of the centroid position in the first direction.

2. In a combination as set forth in claim 1, the additional signal-producing means being displaced from the output means in a second direction co-ordinate with the first direction.

3. In a combination as set forth in claim 1,
    the signal-offsetting means including second decoding means corresponding in construction to the first decoding means and a second plurality of output means corresponding in construction to the first plurality of output means, the second plurality of output means being operatively coupled to the second decoding means in the same operative relationship as that between the first plurality of output means and the first decoding means,
    the first decoding means being disposed in a particular relationship about the centroid position as a fulcrum,
    the second decoding means being disposed in a position defined by a rotation of the second decoding means through an angle of substantially 180° relative to the first decoding means about the centroid position as a fulcrum and the second plurality of output means being disposed in a position defined by a rotation of the second output means through the angle of substantially 180° relative to the first plurality of output means about the centroid position as a fulcrum.

4. In a combination as set forth in claim 3,
    the output means in the first plurality being disposed at a first particular position in a second direction co-ordinate with the first direction and the output means in the second plurality being disposed at a second particular position displaced from the first particular position in the second direction.

5. In a combination as set forth in claim 1,
    the output means in the plurality constituting capacitors.

6. In combination for converting a binary coded value into an analog value,
    means for providing a plurality of signals each having first and second logic levels respectively coding for binary values of "1" and "0" and each identifying a binary value of individual binary significance, the signals in the plurality cumulatively coding for the analog value,
    an integrated circuit chip,
    first means disposed on the integrated circuit chip on opposite sides of a centroid position for decoding the logic levels of the binary signals,
    a first plurality of output means disposed on the chip in a particular relationship to one another on opposite sides of the centroid position and in operatively coupled relationship to the first means to maintain, for progressively increasing analog values coded by the logic levels of the binary signals, the production of signals in the output means previously energized in the plurality and to provide for the production of signals in progressive ones of the output means in the plurality for such progressively increasing analog values,
    second means disposed on the chip in a rotated relationship to the first means of substantially 180° about the centroid position as a fulcrum for decoding the logic levels of the binary signals in the plurality,
    a second plurality of output means disposed on the integrated circuit chip in the particular relationship to one another and in a rotated relationship to the output means in the first plurality of substantially 180° about the centroid position as a fulcrum and in operatively coupled relationship to the second means to maintain, for progressively increasing analog values coded by the logic levels of the binary signals, the production of signals in the output means previously energized in the second plurality and to provide for the production of signals in progressive ones of the output means in the second plurality for such progressively increasing analog values, and means for combining the signals from corresponding ones of the output means of the same binary significance in the first and second pluralities.

7. In a combination as set forth in claim 6, each of the output means in the first plurality having substantially the same position in a first direction relative to the centroid position as the corresponding one of the output means in the second plurality has, relative to the centroid position, in a second direction opposite to the first direction.

8. In a combination as set for in claim 7, each of the output means in the first and second pluralities constituting capacitors.

9. In a combination as set forth in claim 8, the decoding means being formed from a first plurality of switches connected in a repetitive pattern and defining a first network to obtain the operation of the switches in a pattern dependent upon the logic levels of the associated binary signals and to obtain the production of signals in the associated ones of the capacitors in the first plurality in accordance with the pattern of the operation of the switches and the second decoding means being formed from a second plurality of switches connected in a second repetitive pattern coresponding to the first repetitive pattern of the switches in the first network and defining a second network corresponding to the first network.

10. In combination for converting a binary coded value to an analog value, means for providing a plurality of binary signals each having first and second logic levels respectively coding for binary "1" and binary "0" and each coding for a binary value of individually weighted significance, the binary signals in the plurality cumulatively representing the analog value, a plurality of output means, means associated with the signal providing means and the output means in the plurality for decoding the logic levels of the signals from the signal providing means and for energizing the output means in the plurality in accordance with such decoding, an integrated circuit chip, the signal providing means, the output means in the plurality and the decoding means being disposed on the integrated circuit chip, the output means in the plurality being disposed on the integrated circuit chip in individual positions in a first direction relative to a centroid position to provide signals having differential non-linearities resulting from such individualities in disposition, means disposed on the integrated circuit chip and co-operative with the output means in the plurality for producing additional signals each having characteristics corresponding to the characteristics of an individual one of the signals from the output means in the plurality but offsetting the differential non-linearity produced in the signal from such individual one of the output means in the plurality as a result of such individuality in disposition, and means for combining the signals from the output means in the plurality and the additional signals from the signal-offsetting means to obtain signals representing the analog value.

11. In a combination such as recited in claim 10, the signal-offsetting means including a second plurality of means for providing signals having differential non-linearities of substantially the same magnitudes as, but of opposite polarities to, the non-linearities provided in the signals from the individual ones of the output means in the plurality.

12. In the combination as set forth in claim 11, the output means in the plurality being disposed at a first particular position in a second direction coordinate with the first direction and the signal-offsetting means including a second plurality of output means disposed at a second particular position displaced from the first particular position in the second direction.

13. In a combination as set forth in claim 12, the signal-offsetting means further including second decoding means responsive to the binary signals in the plurality in a relationship corresponding to the response of the first decoding means to the binary signals in the plurality.

14. In a combination as set forth in claim 13, the output means in the first and second pluralities constituting capacitors and the capacitors in the second plurality and the second decoding means being disposed on the integrated circuit chip in a rotated relationship of substantially 180° about the centroid as a fulcrum with respect to the disposition of the capacitors in the first plurality and the first decoding means on the integrated circuit chip about the centroid as a fulcrum.

15. In a combination as set forth in claim 13, the output means in the first and second pluralities constituting capacitors of substantially equal values and the capacitors in the first and second pluralities and the first and second decoding means being constructed to provide monotonic conversions to the analog value of the binary coded values coded by the logic levels of the binary signals in the plurality.

16. In combination for converting binary coded values into analog values, means for providing a plurality of binary signals each coded to represent an individually weighted binary value and each having first and second logic levels respectively coding for binary "0" and binary "1", the binary signals in the plurality cumulatively coding for the analog value, a first plurality of output means, a second plurality of output means, means operatively coupled to the signal means and the output means in the first and second pluralities to decode the logic levels of the binary signals and to activate the output means in the first and second pluralities in accordance with such decoding, an integrated circuit chip, the first and second pluralities of output means being disposed on the integrated circuit chip in a particular pattern in a first direction, the output means in each of the first and second pluralities having a centroid position in the first direction, the output means in the second plurality being disposed in a position defined by a rotation through an angle of substantially 180° on the circuit chip relative to the output means in the first plurality about the centroid position means for combining the signal from each individual one of the output means in the first plurality and the signal from the corresponding one of the output means in the second plurality, and the centroid position being substantially midway along the disposition of the output means in the first and second pluralities in the first direction.

17. In a combination as set forth in claim 16, the output means in the first plurality being displaced from one another in a first vectorial direction relative to the centroid position and the output means in the second plurality having the same displacement from one another relative to the centroid position in a second vectorial direction opposite to the first vectorial direction.

18. In a combination as set forth in claim 17, each of the output means in the first plurality having a first particular position in a direction co-ordinate with the first and second vectorial directions and each of the output means in the second plurality having a second particular disposition displaced in the co-ordinate direction from the first particular position.

19. In a combination as set forth in claim 17, each of the output means in the first plurality being displaced by an individual distance from the centroid position in the first vectorial direction and the corresponding one of the output means in the second plurality being displaced by such individual distance from the centroid position in the second vectorial direction.

20. In a combination for converting a binary coded value into an analog value, means for providing a plurality of signals each having logic levels coding for binary values of "1" and "0", each of the binary signals in the plurality coding for a binary value of individually weighted significance and the binary signals in the plurality cumulatively coding for the analog value, means responsive to the binary coded signals in the plurality for decoding the signals, means including a plurality of output means operatively coupled to the decoding means for producing signals in the output means in the plurality in accordance with the analog value coded by the logic levels of the binary signals, an integrated circuit chip, the signal providing means, the decoding means and the output means in the plurality being disposed on the integrated circuit chip, the output means in the plurality having progressive variations in thickness at progressively displaced positions on the chip to provide differential non-linearities in the characteristics of the signals produced in the output means in the plurality in accordance with such variations in thickness, means associated with the output means in the plurality for producing additional signals having differential non-linearities substantially offsetting the differential non-linearities produced in the signals from the output means in the plurality by the variations in the thicknesses of the output means in the plurality, and means for combining the signals from the output means in the plurality and the signals from the signal-offsetting means to produce signals representing the analog value and having characteristics substantially independent of any differential non-linearities in the signals from the output means in the plurality.

21. A combination as set forth in claim 20, the output means in the plurality being displaced from one another in a first direction relative to a centroid position to produce the differential non-linearities in the signals from such output means in accordance with the displacement of such output means in the first direction from the centroid position.

22. In a combination as set forth in claim 21, the decoding means including a plurality of switches connected in a repetitive pattern defining a network responsive to the logic levels of the signals from the binary signal means for providing, for progressively increasing analog values coded by the logic levels of the binary signals, an operation of the switches in a pattern dependent upon the logic levels of the binary coded input signals and a production of signals in the output means previously producing signals in the plurality and the production of signals in additional output means in the plurality, such production of signals occurring in the output means in accordance with the pattern of operation of the switches, the signals-offsetting means including an additional plurality of output means each associated with an individual one of the output means in the first plurality and operatively coupled to the associated one of the output means in the first plurality.

23. In a combination as set forth in claim 22, the decoding means including a plurality of switches, the same switches in the plurality being responsive to the binary signals in the plurality and defining the matrix relationship, the output means in the first and second pluralities constituting capacitors.

24. In a combination as set forth in claim 22, the switches in the plurality being disposed in sub-sets each responsive to an individual one of the binary signals in the plurality, the switches in each sub-set having the same pattern of connections to the switches in the sub-set of next highest binary significance as the pattern of connections of the switches in other sub-sets to the switches in the subsets of next highest binary significance relative to such other sub-sets, and the output means in the additional plurality being substantial duplicates of the output means in the first plurality and being disposed in a position defined by a rotation of the output means in the second plurality through an angle of substantially 180° about the centroid position relative to the output means in the first plurality.

25. In combination for converting between binary coded values and analog values, means for providing a plurality of binary signals each having first and second binary values respectively coding for binary values of "1" and "0" and each having an individually weighted binary significance, the binary signals cumulatively coding for the analog value, means for decoding the binary signals, a plurality of output means responsive to the signals from the decoding means to produce a signal representing the analog value, an integrated circuit chip, the binary signal means, the decoding means and the output means in the plurality being disposed on the integrated circuit chip with each individual one of the output means in the plurality being displaced from a centroid position by an individual distance to provide a differential non-linearity in the signal from such individual one of the output means in accordance with such displacement, and means for producing additional signals providing an offset individually for the differential non-linearity in the signal from each individual one of the output means in the plurality on the integrated circuit chip in accordance with the displacement of such individual one of the output means from the centroid position on the integrated circuit chip.

26. In a combination as set forth in claim 25, the signal-offsetting means including a second plurality of output means disposed on the integrated circuit chip, each of the output means in the second plurality being paired with a corresponding one of the output means in the first plurality.

27. In a combination as set forth in claim 26, each of the output means in the second plurality being disposed to produce a signal having a differential non-linearity of substantially the same magnitude as, but an opposite polarity to, the differential non-linearity of the signal from the paired one of the output means in the first plurality.

28. In a combination as set forth in claim 27, each of the output means in the second plurality being symmetrically displaced from the centroid position relative to the paired one of the output means in the first plurality.

29. In a combination as set forth in claim 1, the output means in the plurality constituting resistances.

30. In a combination as set forth in claim 7, each of the output means in the first and second pluralities constituting resistances.

31. In a combination as set forth in claim 14, the output means in the first and second pluralities constituting resistances and the resistances in the second plurality being disposed on the integrated circuit in a rotated relationship about the centroid as a fulcrum with respect to the disposition of the resistances in the first plurality on the integrated circuit chip about the centroid as a fulcrum.

32. In a combination as set forth in claim 22, the decoding means including a plurality of switches, the same switches in the plurality being responsive to the binary signals in the plurality and defining the matrix relationship, the output means in the first and second pluralities constituting resistors.

* * * * *